(12) United States Patent
Kong et al.

(10) Patent No.: US 9,455,675 B2
(45) Date of Patent: Sep. 27, 2016

(54) AMPLIFIER AND AMPLIFICATION METHOD

(71) Applicant: Beken Corporation, Shanghai (CN)

(72) Inventors: Ronghui Kong, Shanghai (CN); Dawei Guo, Shanghai (CN)

(73) Assignee: BEKEN CORPORATION, Shanghai (CN)

( * ) Notice: Subject to any disclaimer, the term of this patent is extended or adjusted under 35 U.S.C. 154(b) by 59 days.

(21) Appl. No.: 14/554,001

(22) Filed: Nov. 25, 2014

(65) Prior Publication Data

US 2016/0118939 A1    Apr. 28, 2016

(30) Foreign Application Priority Data

Oct. 23, 2014    (CN) .......................... 2014 1 0572751

(51) Int. Cl.
*H03F 3/04* (2006.01)
*H03F 3/30* (2006.01)
*H03F 1/30* (2006.01)
*H03K 3/3565* (2006.01)

(52) U.S. Cl.
CPC ............ *H03F 3/3022* (2013.01); *H03F 1/308* (2013.01); *H03F 2200/135* (2013.01); *H03F 2200/456* (2013.01); *H03F 2200/555* (2013.01); *H03F 2203/30031* (2013.01); *H03F 2203/30078* (2013.01); *H03K 3/3565* (2013.01)

(58) Field of Classification Search
CPC .................................................... H03F 1/0205
USPC ......................... 330/296, 278, 285, 298, 311
See application file for complete search history.

(56) References Cited

U.S. PATENT DOCUMENTS 5,250,914 A * 10/1993 Kondo .................. H03K 3/011
331/111

OTHER PUBLICATIONS

Op Amp Power Supply Rejection Ratio (PSRR) and Supply Voltages, Analog Devices, MT-043 Tutorial, http://www.analog.com/static/imported-files/tutorials/MT-043.pdf, Oct. 2008.
Understanding Single-Ended, Pseudo-Differential and Fully-Differential ADC Inputs, Application Note 1108, http://www.maximintegrated.com/en/app-notes/index.mvp/id/1108, Jun. 14, 2002.

* cited by examiner

*Primary Examiner* — Khanh V Nguyen
*Assistant Examiner* — Khiem Nguyen
(74) *Attorney, Agent, or Firm* — Perkins Coie LLP

(57) ABSTRACT

An amplifier comprises a biasing unit, an amplifying unit and a Schmitt trigger. The biasing unit is configured to generate a bias current which is independent of the power supply, so as to increase power supply rejection ratio. The amplifying unit is connected to the biasing unit and configured to receive an input voltage and generate an amplified voltage based on the biasing current. The Schmitt trigger is connected to the amplifier and configured to generate and output a modified voltage.

22 Claims, 8 Drawing Sheets

AMPLIFIER AND AMPLIFICATION METHOD

CROSS REFERENCE TO RELATED APPLICATIONS

This application claims priority to Chinese Application No. 201410572751.0 entitled "amplifier and amplification method," filed on Oct. 23, 2014 by Beken Corporation, which is incorporated herein by reference.

TECHNICAL FIELD

The present application relates to circuits, and more particularly but not exclusively to an amplifier and a method for increasing power supply rejection ratio.

BACKGROUND

The Power Supply Rejection Ratio (PSRR) is defined as the ratio of the change in supply voltage in the operational amplifier to the equivalent (differential) output voltage it produces, and is used to describe the amount of noise from a power supply that a particular device can reject. The larger the PSRR ratio, the better a circuit performs against the power noise. It is desirable to have a device and method that can increase PSRR.

SUMMARY OF THE INVENTION

In an embodiment, an amplifier comprises a biasing unit, configured to generate a bias current which is independent of the power supply, so as to increase power supply rejection ratio; an amplifying unit connected to the biasing unit and configured to receive an input voltage and generate an amplified voltage based on the biasing current; a Schmitt trigger connected to the amplifying unit and configured to generate and output a modified voltage by rectifying the amplified voltage to square wave.

In another embodiment, a method of amplifying comprises generating a bias current which is independent of the power supply, so as to increase power supply rejection ratio; receiving an input voltage and generating an amplified voltage based on the biasing current; outputting a modified voltage by rectifying the amplified voltage to square wave.

BRIEF DESCRIPTION OF THE DRAWINGS

Non-limiting and non-exhaustive embodiments of the present invention are described with reference to the following figures, wherein like reference numerals refer to like parts throughout the various views unless otherwise specified.

DETAILED DESCRIPTION OF THE ILLUSTRATED EMBODIMENTS

Various aspects and examples of the invention will now be described. The following description provides specific details for a thorough understanding and enabling description of these examples. Those skilled in the art will understand, however, that the invention may be practiced without many of these details. Additionally, some well-known structures or functions may not be shown or described in detail, so as to avoid unnecessarily obscuring the relevant description.

Figure 1:
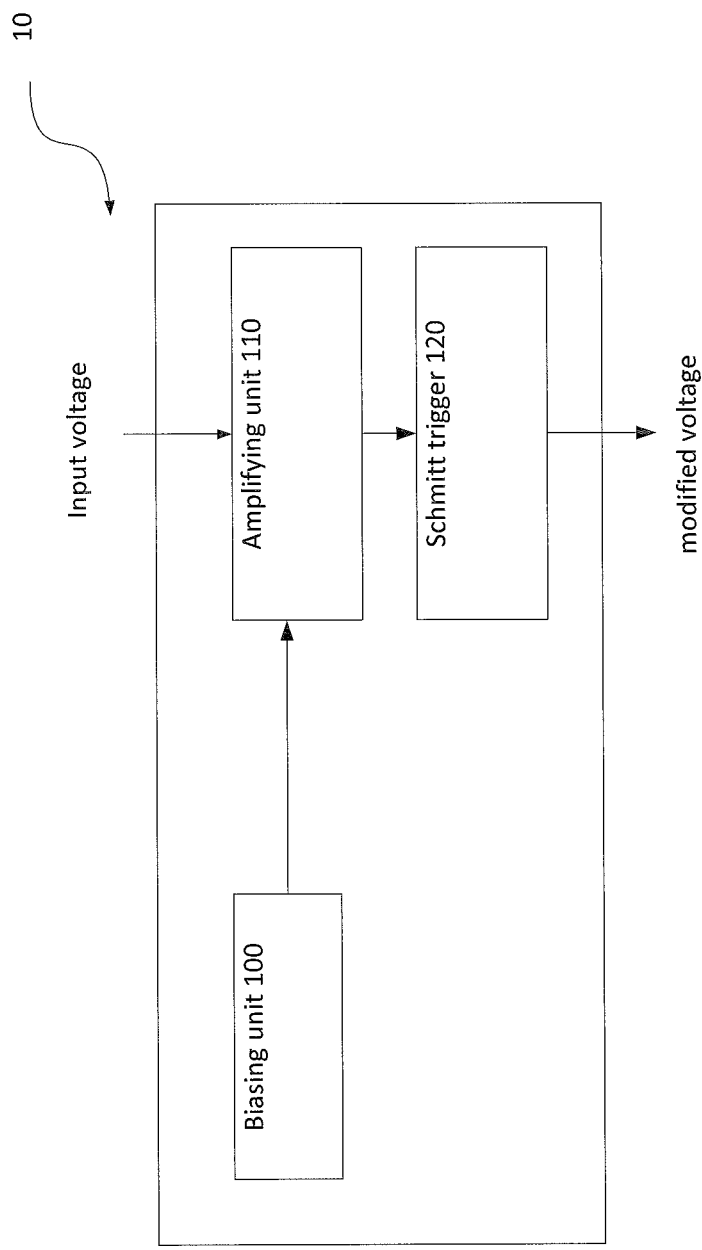
FIG. 1 is a diagram illustrating an embodiment of amplifier.

FIG. 1 is a diagram illustrating an amplifier 10. The amplifier 10 comprises a biasing unit 100, an amplifying unit 110, and a Schmitt trigger 120. The biasing unit 100 is configured to generate a bias current which is independent of the power supply, so as to increase power supply rejection ratio. The amplifying unit 110 is connected to the biasing unit 100 and is configured to receive an input voltage and generate an amplified voltage based on the biasing current. The Schmitt trigger 120 is connected to the amplifying unit 110, and is configured to generate and output a modified voltage by rectifying the amplified voltage to square wave.

Figure 2:
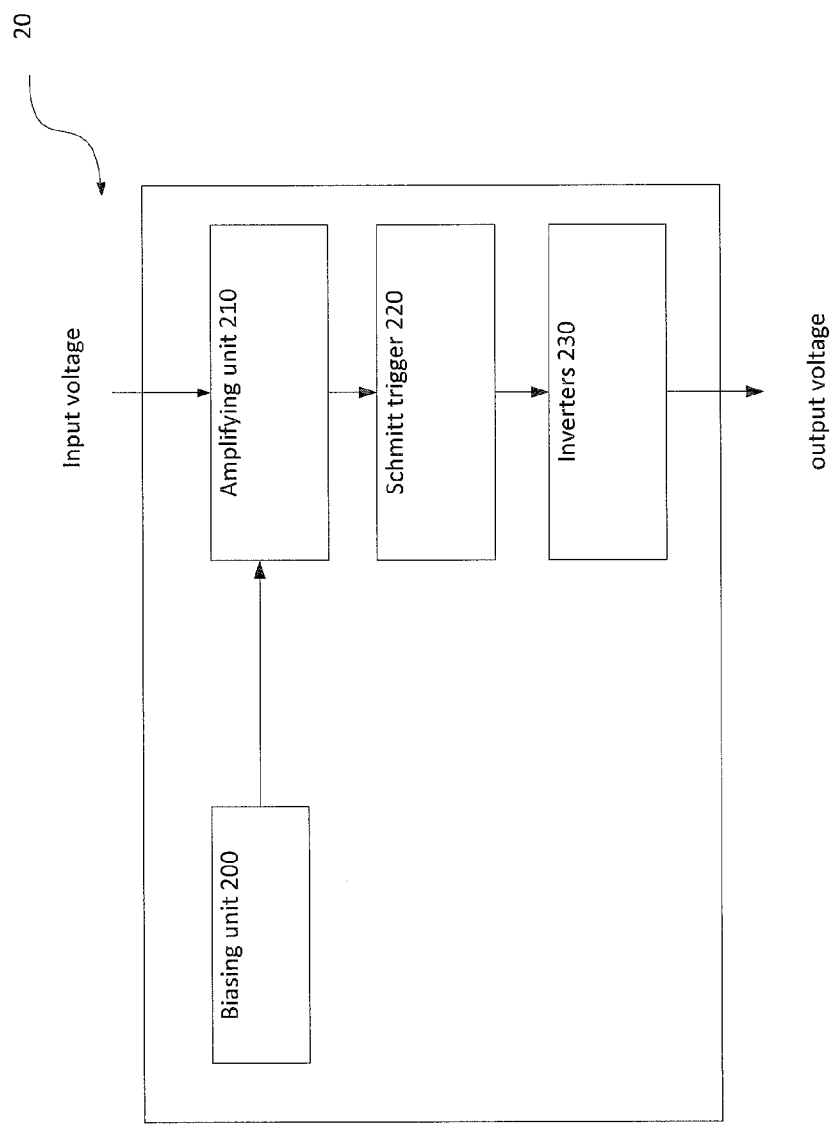
FIG. 2 is a diagram illustrating another embodiment of an amplifier.

FIG. 2 is a diagram illustrating another embodiment of an amplifier 20. A biasing unit 200, an amplifying unit 210, and a Schmitt trigger 220 are respectively similar to the biasing unit 100, the amplifying unit 110, and the Schmitt trigger 120 shown in FIG. 1, therefore details are omitted for elements already described with respect to FIG. 1. The amplifier 20 further comprises at least one inverter 230. The at least one inverter 230 is connected to the Schmitt trigger 220 and the at least one inverter 230 is configured to generate an output voltage by buffering the modified voltage. The inverter 230 further improves drive capability of the amplifier 20, so that the output current can charge a load more quickly.

Figure 3:
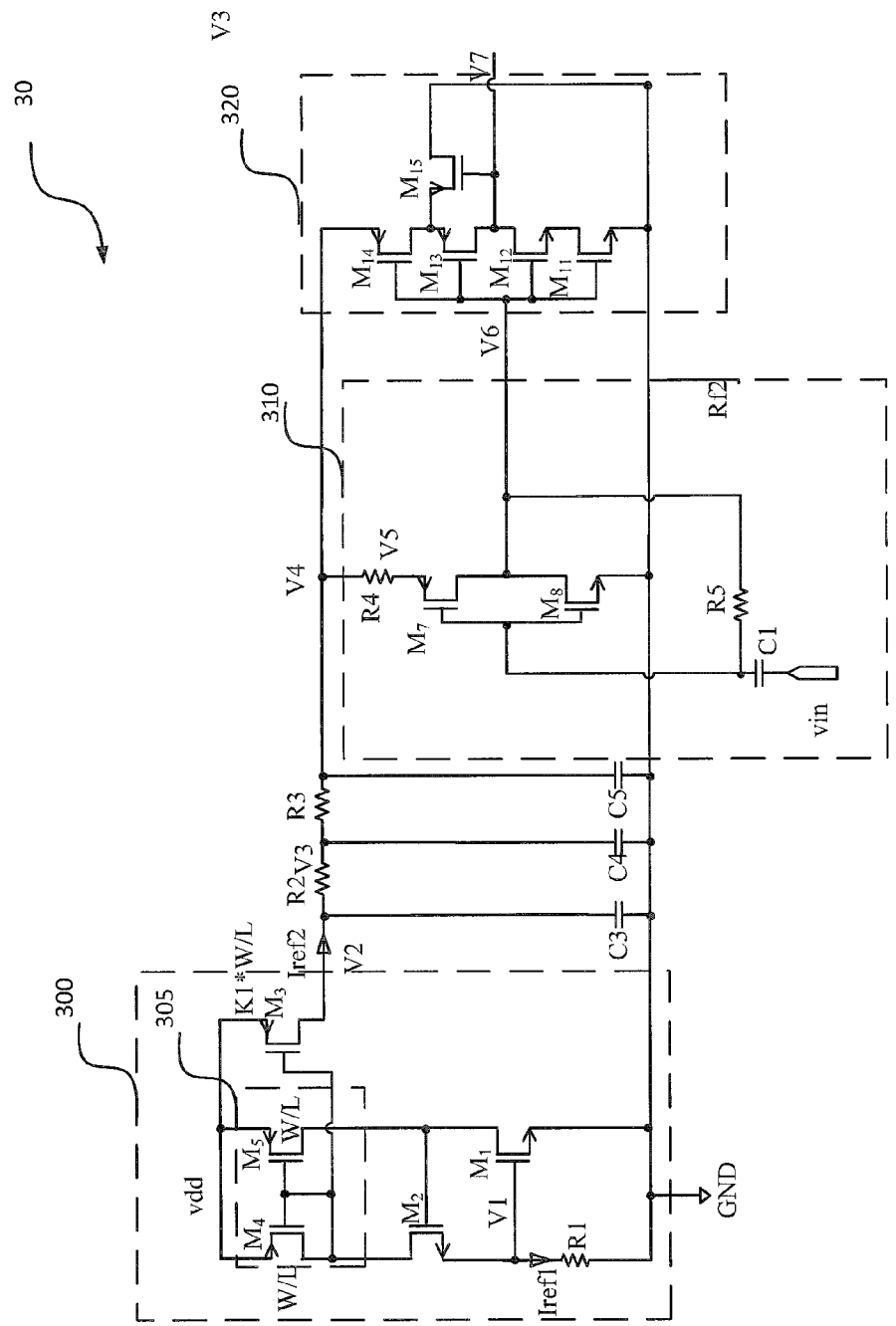
FIG. 3 is a diagram illustrating an embodiment of the amplifier shown in FIG. 1.

FIG. 3 is a diagram illustrating an embodiment of the amplifier shown in FIG. 1. The amplifier 30 comprises a biasing unit 300, an amplifying unit 310, a Schmitt trigger 320. The biasing unit 300 comprises a first NMOS transistor $M_1$, a second NMOS transistor $M_2$, a third PMOS transistor $M_3$, a current mirror 305, a first resistor R1.

A source of the first NMOS transistor $M_1$ is connected to a ground. A gate of the first NMOS transistor $M_1$ is connected to both the first resistor R1 and a source of the second NMOS transistor $M_2$. The second NMOS transistor $M_2$ operates as clamping transistor to clamp a voltage on the drain of the first NMOS transistor $M_1$. A drain of the first NMOS transistor $M_1$ is connected to both a gate of the second NMOS transistor $M_2$ and a first port of the current mirror 305. The current mirror 305 is represented as a dashed block. A drain of the second NMOS transistor $M_2$ is connected to a second port of the current mirror 305. A source of the third PMOS transistor $M_3$ is connected to a positive voltage supply vdd. A drain of the third PMOS transistor $M_3$ is configured to output the biasing current Iref2. The current that passes through the first resistor R1 includes a reference current Iref1. Iref1 can be represented as:

$$Iref1 = \left( \frac{1 + \sqrt{a + 4 \times R1 \times Vth1 \times a}}{2 \times \sqrt{a} \times R1} \right)^2 \tag{1}$$

Wherein $a=0.5 \times un \times Cox \times W1/L1$. W1 represents channel width of the first NMOS transistor M1. L1 represents channel length of the first NMOS transistor M1. Vth1 represents threshold of the first NMOS transistor M1. un is a constant value, and represents electron mobility. Cox represents a capacitance of a gate oxide capacitor. It can be determined from the above equation that Iref is independent of the power source vdd. Also note that Iref2=k*Iref1, therefore Iref2 is also independent of the power source vdd. As the biasing current Iref2 is independent of the power source vdd, the Power Supply Rejection Ratio can be improved with embodiments of the invention.

Alternatively, as shown in FIG. 3, the current source 305 further comprises a fourth PMOS transistor $M_4$ and a fifth PMOS transistor $M_5$. The first port the current mirror 305 comprises a drain of the fifth PMOS transistor $M_5$. The second port of the current mirror 305 comprises a drain of the fourth PMOS transistor $M_4$. The gate of the fourth PMOS transistor $M_4$ is connected to a gate of the fifth PMOS transistor $M_5$. Both sources of the fourth PMOS transistor $M_4$ and the fifth PMOS transistor $M_5$ are connected to the positive power supply vdd.

The amplifying unit 310 comprises a seventh PMOS transistor $M_7$, an eighth NMOS transistor $M_8$, a first capacitor C1 and a fifth resistor R5. Both gates of the seventh PMOS transistor $M_7$ and the eighth NMOS transistor $M_8$ are configured to receive an input voltage Vin via the first capacitor C1. Note the input voltage Vin can be provided by an oscillator not shown in FIG. 3. The first capacitor C1 is configured to provide instantaneous current to the amplifying unit 310, and further blocks the direct current. Both drains of the seventh PMOS transistor $M_7$ and the eighth NMOS transistor $M_8$ are connected to the Schmitt trigger 320. The source of the seventh PMOS transistor $M_7$ is connected to the drain of the third PMOS transistor $M_3$ via a second resistor R2, a third resistor R3 and a fourth resistor R4 in serials. A source of the eighth NMOS transistor $M_8$ is connected to the ground. The fifth resistor R5 is connected between the first capacitor C1 and the drain of the eighth NMOS transistor $M_8$. The fifth resistor R5 operates as a feedback resistor between drains of the seventh PMOS transistor $M_7$ and eighth NMOS transistor $M_8$ and gates of the seventh PMOS transistor $M_7$ and eighth NMOS transistor Mg.

The Schmitt trigger 320 comprises an eleventh NMOS transistor $M_{11}$, a twelfth NMOS transistor $M_{12}$, a thirteenth PMOS transistor $M_{13}$, a fourteenth PMOS transistor $M_{14}$, and a fifteenth PMOS transistor $M_{15}$. Gates of all of the eleventh NMOS transistor $M_{11}$, the twelfth NMOS transistor $M_{12}$, the thirteenth PMOS transistor $M_{13}$ and the fourteenth PMOS transistor $M_{14}$ are connected to the drain of the seventh PMOS transistor $M_7$. A source of the fourteenth PMOS transistor $M_{14}$ is connected to the third resistor R3. A drain of the fourteenth PMOS transistor $M_{14}$ is connected to a source of the thirteenth PMOS transistor $M_{13}$. A drain of the thirteenth PMOS transistor $M_{13}$ is connected to a drain of the twelfth NMOS transistor $M_{12}$. A source of the twelfth NMOS transistor $M_{12}$ is connected to a drain of the eleventh NMOS transistor $M_{11}$. A source of the eleventh NMOS transistor $M_{11}$ is connected to the ground.

A source of the fifteenth PMOS transistor $M_{15}$ is connected to the source of the thirteenth PMOS transistor $M_{13}$. A gate of the fifteenth PMOS transistor M15 is connected to the drain of the thirteenth PMOS transistor $M_{13}$. A drain of the fifteenth PMOS transistor $M_{15}$ is connected to the ground. The Schmitt trigger 320 can cancels glitch with its Hysteresis curve.

Figure 4:
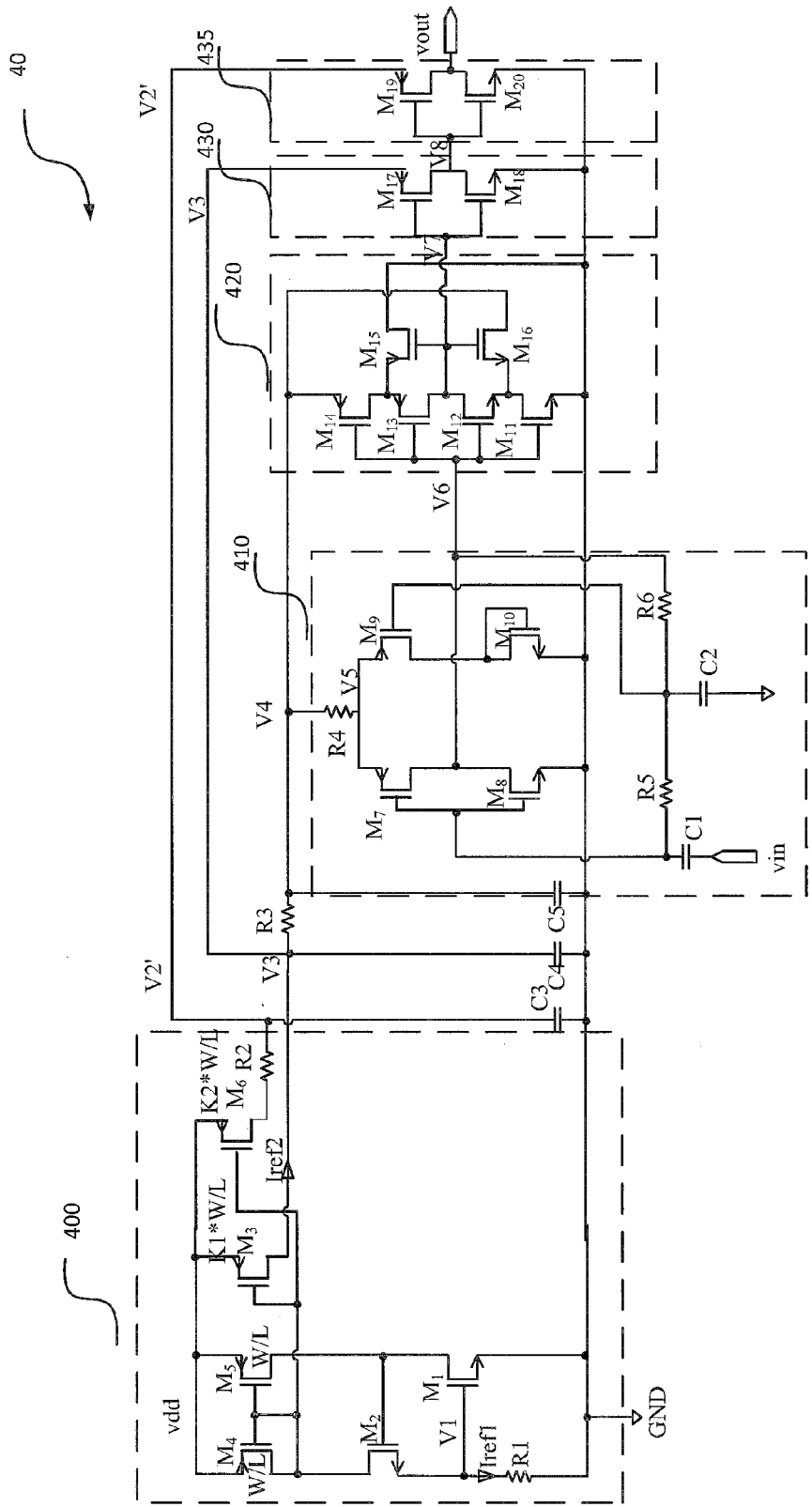
FIG. 4 is a diagram illustrating an embodiment of the amplifier shown in FIG. 2.

FIG. 4 is a diagram illustrating another embodiment of the amplifier shown in FIG. 2. The amplifier 40 further comprises a sixth PMOS transistor $M_6$, a first inverter 430 and a second inverter 435. The first inverter 430 is connected to the Schmitt trigger 420, and the second inverter 435 is connected to the first inverter 430 and is configured to generate an output voltage vout by buffering the modified voltage V6.

A source of the sixth PMOS transistor $M_6$ is connected to the positive power supply Vdd. A gate of the sixth PMOS transistor $M_6$ is connected to the gate of the third PMOS transistor $M_3$. A drain of the sixth PMOS transistor $M_6$ is connected to the second inverter 435 via a second resistor R2 and is configured to provide a power supply for the second inverter 435. The sixth PMOS transistor M6 is configured to provide voltage V2'. The sixth PMOS transistor M6 is configured to provide bias voltage V2' to the inverter stage V35 so as to improve the overall PSRR. The sixth PMOS transistor $M_6$ has a size of K2*W/L, while the third PMOS transistor $M_3$ has a size of K1*W/L. Further the fourth PMOS transistor $M_4$ and the fifth PMOS transistor $M_5$ have the same size of W/L. The transistor M3 provides bias voltage V3 to inverter 430. As the latter stage 435 has a lower power consumption relative to the preceding stage 430, K2 may be smaller than K1.

The amplifying unit 410 further comprises a ninth PMOS transistor $M_9$, a tenth NMOS transistor $M_{10}$, a second capacitor C2, and a sixth resistor R6. A source of the ninth PMOS transistor $M_9$ is connected to the source of the seventh PMOS transistor $M_7$. A gate of the ninth PMOS transistor $M_9$ is connected to the ground via the second capacitor C2. A drain the ninth PMOS transistor $M_9$ is connected to both a gate and a drain of the tenth NMOS transistor $M_{10}$. A source of the tenth NMOS transistor $M_{10}$ is connected to the ground. The sixth resistor R6 is connected between the second capacitor C2 and the drain of the eighth NMOS transistor Mg so as to provide a feedback path.

During operation, as the seventh PMOS transistor $M_7$ and the ninth PMOS transistor $M_9$ form a pair, the eighth NMOS transistor Mg and the tenth NMOS transistor $M_{10}$ form a pair, they form a Pseudo-Differential input structure, which further cancels common mode voltage, therefore cancels noise from the power supply.

As shown in FIG. 4, the Schmitt trigger 420 comprises an eleventh NMOS transistor $M_{11}$, a twelfth NMOS transistor $M_{12}$, a thirteenth PMOS transistor $M_{13}$, a fourteenth PMOS transistor $M_{14}$, and a fifteenth PMOS transistor $M_{15}$. As MOS transistors $M_{11}$, $M_{12}$, $M_{13}$ and $M_{14}$ are similar to that shown in FIG. 3, details are omitted for the elements already discussed with respect to FIG. 3. The Schmitt trigger 420 further comprises a sixteenth NMOS transistor $M_{16}$. A source of the sixteenth NMOS transistor $M_{16}$ is connected to the source of the twelfth NMOS transistor $M_{12}$. A gate of the sixteenth NMOS transistor M16 is connected to the gate of the fifteenth PMOS transistor $M_{15}$. A drain of the sixteenth NMOS transistor $M_{16}$ is connected the third resistor R3.

The first inverter 430 further comprises a seventeenth MOS transistor $M_{17}$ and an eighteenth MOS transistor $M_{18}$. A source of the seventeenth PMOS transistor $M_{17}$ is connected to the third resistor R3. Both gates of the seventeenth PMOS transistor $M_{17}$ and the eighteenth NMOS transistor $M_{18}$ are connected to the drain of the twelfth NMOS transistor $M_{12}$. A drain of the seventeenth PMOS transistor $M_{17}$ is connected to a drain of the eighteenth NMOS transistor $M_{18}$. A source of the eighteenth NMOS transistor $M_{18}$ is connected to the ground.

In FIG. 4, the amplifier 40 further comprises a second inverter 435. The second inverter 435 further comprises a nineteenth PMOS transistor $M_{19}$ and an twentieth NMOS transistor $M_{20}$. A source of the nineteenth PMOS transistor $M_{19}$ is connected to the second resistor R2. Both gates of the nineteenth PMOS transistor M19 and the twentieth MOS transistor $M_{20}$ are connected to the drain of the seventeenth PMOS transistor $M_{17}$. A drain of the nineteenth PMOS transistor $M_{19}$ is connected to a drain of the twentieth NMOS transistor $M_{20}$. A source of the twentieth NMOS transistor $M_{20}$ is connected to the ground. Both drains of the nineteenth PMOS transistor $M_{19}$ and the twentieth NMOS transistor $M_{20}$ are configured to output voltage.

Figure 5:
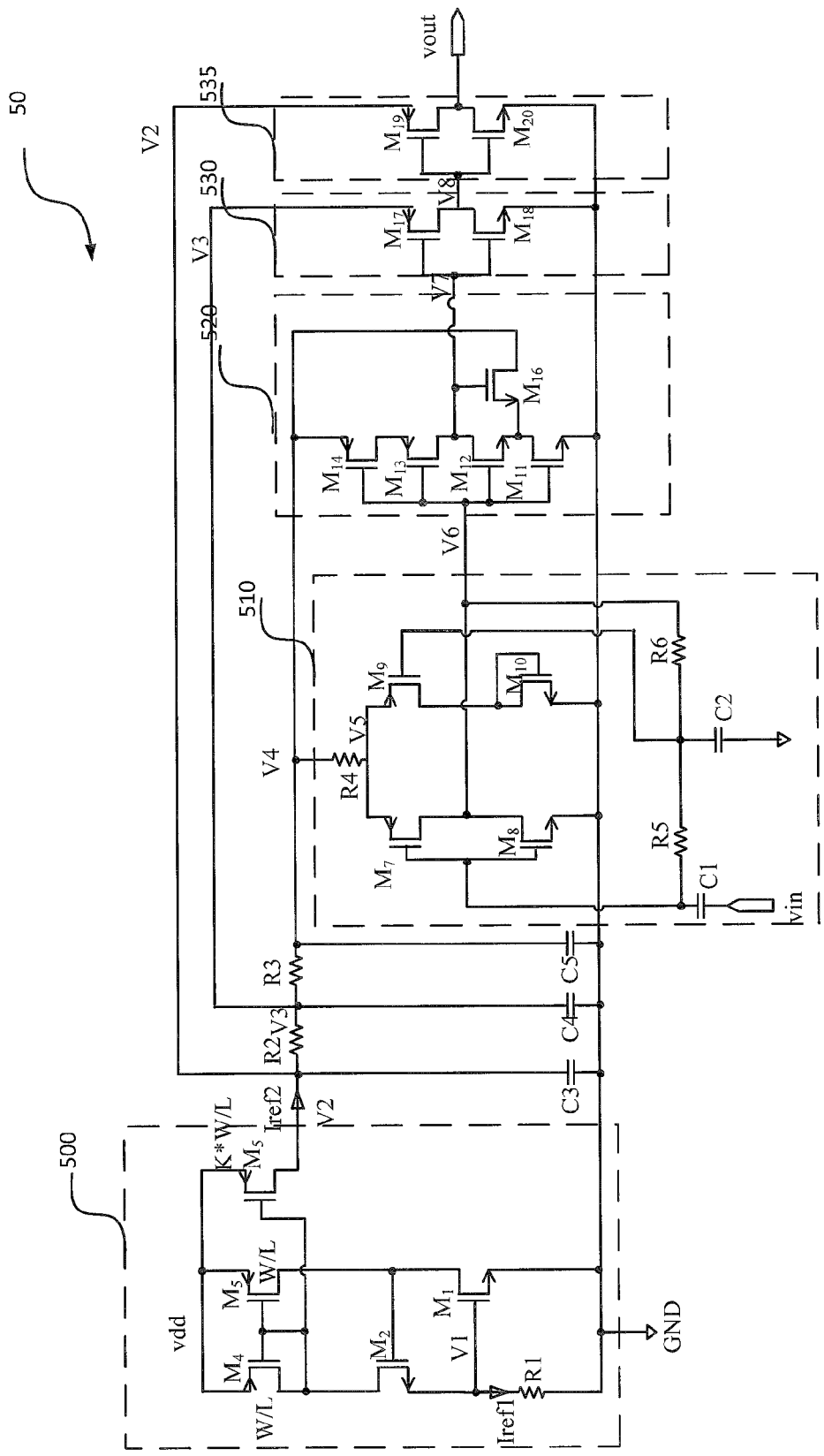
FIG. 5 is a diagram illustrating another embodiment of the amplifier shown in FIG. 2.

FIG. 5 is a diagram illustrating another embodiment of the amplifier shown in FIG. 2. The amplifier 50 comprises a biasing unit 500, an amplifying unit 510, a Schmitt trigger 520, a first inverter 530 and a second inverter 535. A biasing unit 500, an amplifying unit 510, the first inverter 530 and the second inverter 535 are respectively similar to the biasing unit 400, the amplifying unit 410, the first inverter 430 and the second inverter 435 shown in FIG. 4, therefore details are omitted for elements already described with respect to FIG. 4. The Schmitt trigger 520 comprises an eleventh NMOS transistor $M_{11}$, a twelfth NMOS transistor $M_{12}$, a thirteenth PMOS transistor $M_{13}$, a fourteenth PMOS transistor $M_{14}$, and a sixteenth NMOS transistor $M_{16}$. Gates of all of the eleventh NMOS transistor $M_{11}$, the twelfth NMOS transistor $M_{12}$, the thirteenth PMOS transistor $M_{13}$ and the fourteenth PMOS transistor $M_{14}$ are connected to the drain of the seventh PMOS transistor $M_7$. A source of the fourteenth PMOS transistor $M_{14}$ is connected to the third resistor R3. A drain of the fourteenth PMOS transistor $M_{14}$ is connected to a source of the thirteenth PMOS transistor $M_{13}$. A drain of the thirteenth PMOS transistor $M_{13}$ is connected to a drain of the twelfth NMOS transistor $M_{12}$. A source of the twelfth NMOS transistor $M_{12}$ is connected to a drain of the eleventh NMOS transistor $M_{11}$. A source of the eleventh NMOS transistor $M_{11}$ is connected to the ground. A source of the sixteenth NMOS transistor $M_{16}$ is connected to the source of the twelfth NMOS transistor $M_{12}$. A gate of the sixteenth NMOS transistor M16 is connected to a drain of the twelfth NMOS transistor $M_{12}$. A drain of the sixteenth NMOS transistor $M_{16}$ is connected to the third resistor R3.

As shown in FIG. 5, during operation, V5 equals Vthn8+|Vthp7|, V4 equals Vthn8+|Vthp7|+Iref2×R4, V3 equals Vthn8+|Vthp7|+Iref2×(R4+R3), V2 equals Vthn8+|Vthp7|+Iref2×(R4+R3+R2). The high level voltage that V6 outputs equals Vthn8+|Vthp7|, which may be for example 1.3 v. V5 is a DC (direct current) voltage point, and V6 is the signal output point, which outputs AC (alternate current) signals. Note the high voltage level of the output AC signals equals V5. The circuit that needs to be driven by the output voltage vout requires a power of 1.8 v, which does not match the V6 output. According to an embodiment, the power supply increases step by step along the amplifying unit 510, the Schmitt trigger 520, the first inverter 530 and the second inverter 535. Therefore the output voltage vout may reach the requirement of 1.8 v. Meantime, the PSRR is not sacrificed, as the increased power supply further improves PSRR. To be specific, as the preceding stage signals are relatively smaller than the subsequent stages, preceding stages require higher PSRR than the subsequent stages. The subsequent stages have less requirement on PSRR, as the signals in the subsequent stage are amplified and less sensitive to noises. Note the higher the bias voltage, the worse the PSRR. Therefore the preceding stages require lower bias voltage, while the latter stage may have higher bias voltage, such that the overall PSRR will not be deteriorated.

Figure 6:
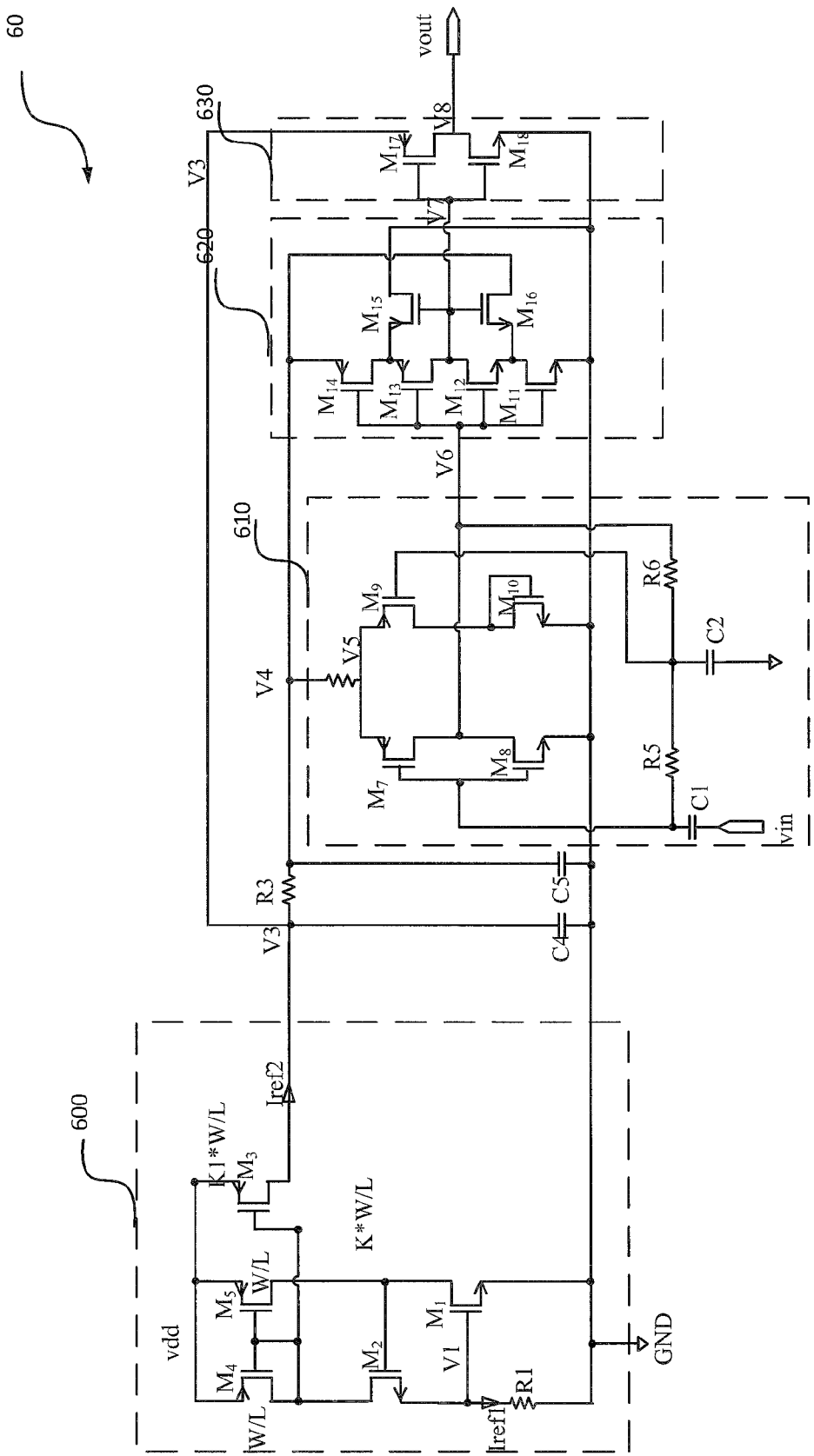
FIG. 6 is a diagram illustrating another embodiment of the amplifier shown in FIG. 2.

FIG. 6 is a diagram illustrating another embodiment of the amplifier shown in FIG. 2. The difference between FIG. 6 and FIG. 4 lies in that the amplifier 60 comprises only one inverter 630, without the second inverter 435 shown in FIG. 4. Further in FIG. 4 it is the sixth PMOS transistor $M_6$ that provides a power supply V2' to the second inverter 435, while in FIG. 6, the sixth PMOS transistor $M_6$ is omitted. As other elements in FIG. 6 are similar to that shown in FIG. 4, details are omitted for elements already discussed with respect to FIG. 4.

Figure 7:
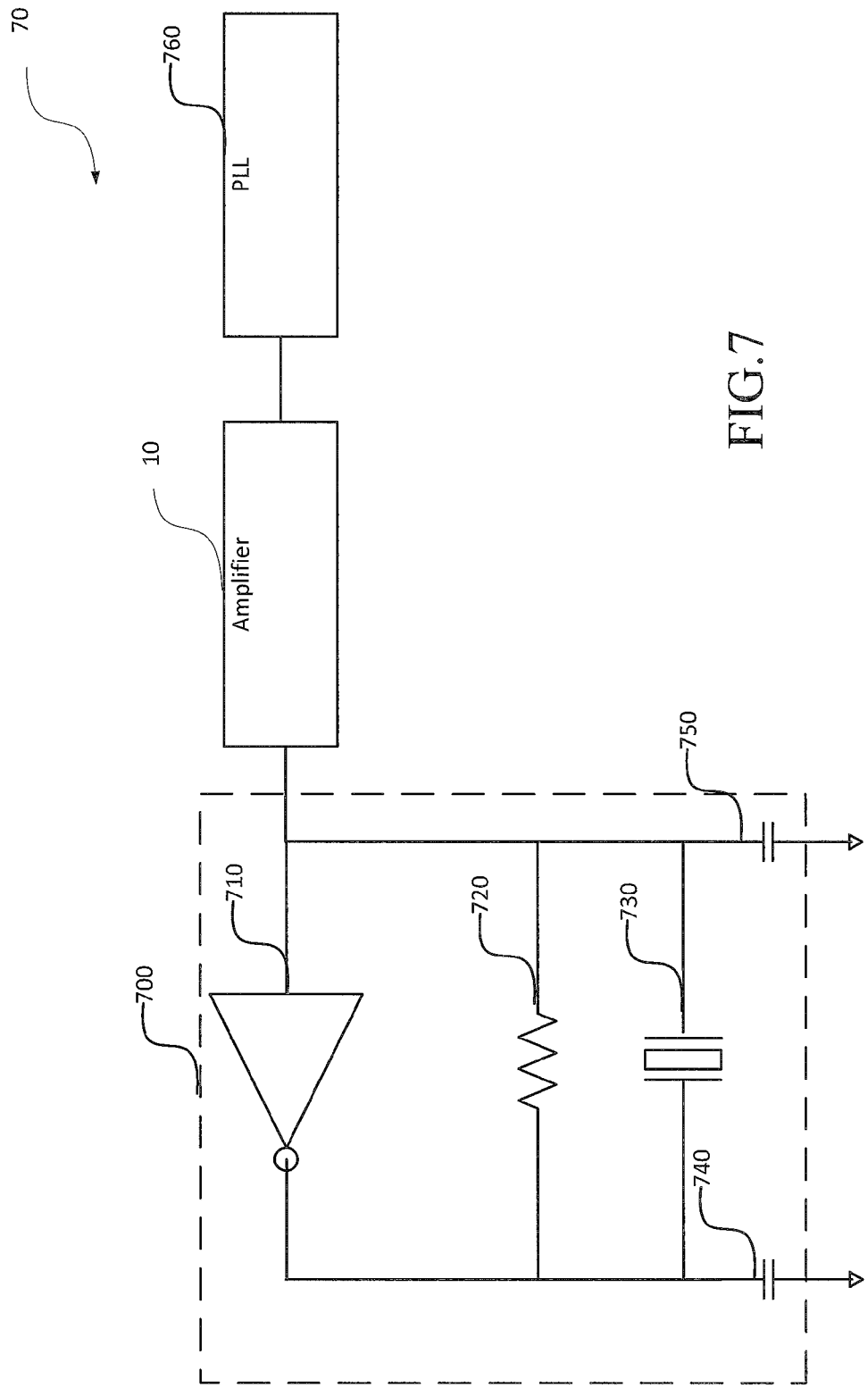
FIG. 7 is an application scenario of the amplifier shown in either FIG. 1 or FIG. 2.

FIG. 7 is an application scenario of the amplifier shown in either FIG. 1 or FIG. 2. The amplifier 10 shown in FIG. 1 or FIG. 2 can be positioned between an oscillator 700 and a phase locked loop (PLL) 760. The amplifier 10 is configured to provide boosted signal to the PLL 760. The oscillator 700 may further comprise a third inverter 710, a seventh resistor 720, a crystal oscillator 730, a sixth capacitor 740 and a seventh capacitor 750. The seventh resistor 720, the sixth capacitor 740 and a seventh capacitor 750 can be configured to adjust oscillation parameter of the crystal oscillator 730.

Figure 8:
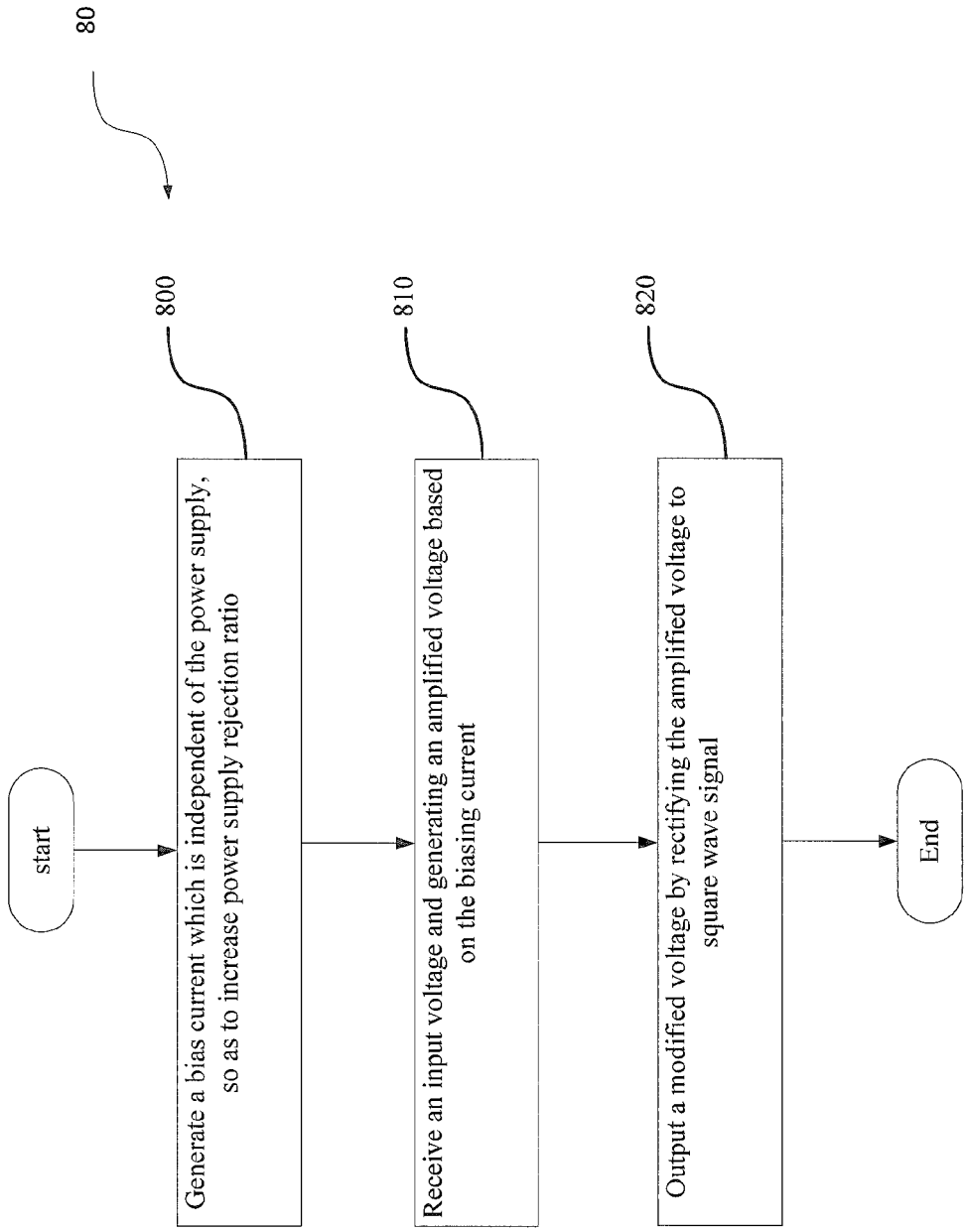
FIG. 8 is a flow chart of a method performed by the amplifier shown in FIG. 1.

FIG. 8 is a flow chart of a method performed by the amplifier shown in FIG. 1. The method 80 of amplifying comprises generating (in block 800) a bias current which is independent of the power supply, so as to increase power supply rejection ratio; receiving (in block 810) an input voltage and generating an amplified voltage based on the biasing current; outputting (in block 820) a modified voltage by rectifying the amplified voltage into square wave signal. Although not shown in FIG. 8, the method 80 may further comprise generating an output voltage by buffering the modified voltage with at least one inverter.

It should be appreciated by those ordinary skill in the art that components from different embodiments may be combined to yield another technical solution. This written description uses examples to disclose the invention, including the best mode, and also to enable any person ordinary skill in the art to practice the invention, including making and using any devices or systems and performing any incorporated methods. The patentable scope of the invention is defined by the claims, and may include other examples that occur to those ordinary skill in the art. Such other examples are intended to be within the scope of the claims if they have structural elements that do not differ from the literal language of the claims, or if they include equivalent structural elements with insubstantial differences from the literal languages of the claims.

What is claimed is:

1. An amplifier comprising:
a biasing unit, configured to generate a bias current which is independent of the power supply, so as to increase power supply rejection ratio;
an amplifying unit connected to the biasing unit and configured to receive an input voltage and generate an amplified voltage based on the biasing current;
a Schmitt trigger connected to the amplifying unit and configured to generate and output a modified voltage;
wherein the biasing unit comprises a first NMOS transistor, a second NMOS transistor, a third PMOS transistor, a current mirror, a first resistor; wherein
a source of the first NMOS transistor is connected to a ground, a gate of the first NMOS transistor is connected to both the first resistor and a source of the second NMOS transistor, a drain of the first NMOS transistor is connected to both a gate of the second NMOS transistor and a first port of the current mirror;
a drain of the second NMOS transistor is connected to a second port of the current mirror;
a source of the third PMOS transistor is connected to a second voltage supply, and a drain of the third PMOS transistor is configured to output the biasing current.

2. The amplifier of claim 1, further comprising
at least one inverter connected to the Schmitt trigger and configured to generate an output voltage by buffering the modified voltage.

3. The amplifier of claim 1, wherein
the current source comprises a fourth PMOS transistor and a fifth PMOS transistor, wherein the first port the current mirror comprises a drain of the fifth PMOS transistor, the second port of the current mirror comprises a drain of the fourth PMOS transistor, the gate of the fourth PMOS transistor is connected to a gate of the fifth PMOS transistor, both sources of the fourth PMOS transistor and the fifth PMOS transistor are connected to the positive power supply.

4. The amplifier of claim 1, further comprising a sixth PMOS transistor, a first inverter and a second inverter both connected to the Schmitt trigger and configured to generate an output voltage by buffering the modified voltage, wherein a source of the sixth PMOS transistor is connected to the positive power supply, a gate of the sixth PMOS transistor is connected to the gate of the third PMOS transistor, a drain of the sixth PMOS transistor is connected to the second inverter and is configured to provide a power supply for the second inverter.

5. The amplifier of claim 4, wherein the first inverter further comprises a seventeenth MOS transistor and an eighteenth MOS transistor,
wherein a source of the seventeenth PMOS transistor is connected to the third resistor, both gates of the seventeenth PMOS transistor and the eighteenth NMOS transistor are connected to the drain of the twelfth NMOS transistor, a drain of the seventeenth PMOS transistor is connected to a drain of the eighteenth NMOS transistor, a source of the eighteenth NMOS transistor is connected to the ground.

6. The amplifier of claim 5, wherein the second inverter further comprises a nineteenth PMOS transistor and an twentieth NMOS transistor,
wherein a source of the nineteenth PMOS transistor is connected to the second resistor, both gates of the nineteenth PMOS transistor and the twentieth MOS transistor are connected to the drain of the seventeenth PMOS transistor, a drain of the nineteenth PMOS transistor is connected to a drain of the twentieth NMOS transistor, a source of the twentieth NMOS transistor is connected to the ground.

7. The amplifier of claim 1, wherein the amplifying unit comprises a seventh PMOS transistor, an eighth NMOS transistor, a first capacitor and a fifth resistor; wherein
both gates of the seventh PMOS transistor and the eighth NMOS transistor are configured to receive an input voltage via the first capacitor; both drains of the seventh PMOS transistor and the eighth NMOS transistor are connected to the Schmitt trigger, and the source of the seventh PMOS transistor is connected to the drain of the third PMOS transistor via a second resistor, a third resistor and a fourth resistor in serials, a source of the eighth NMOS transistor is connected to the ground; wherein the fifth resistor is connected between the first capacitor and the drain of the eighth NMOS transistor.

8. The amplifier of claim 7, wherein the amplifying unit further comprises a ninth PMOS transistor, a tenth NMOS transistor, and a second capacitor, and a sixth resistor; wherein
a source of the ninth PMOS transistor is connected to the source of the seventh PMOS transistor, a gate of the ninth PMOS transistor is connected to the ground via the second capacitor, a drain the ninth PMOS transistor is connected to both a gate and a drain of the tenth NMOS transistor; a source of the tenth NMOS transistor is connected to the ground; wherein the sixth resistor is connected between the second capacitor and the drain of the eighth NMOS transistor.

9. The amplifier of claim 7, wherein the Schmitt trigger comprises an eleventh NMOS transistor, a twelfth NMOS transistor, a thirteenth PMOS transistor, a fourteenth PMOS transistor, and a fifteenth PMOS transistor,
wherein gates of all of the eleventh NMOS transistor, the twelfth NMOS transistor, the thirteenth PMOS transistor and the fourteenth PMOS transistor are connected to the drain of the seventh PMOS transistor;
a source of the fourteenth PMOS transistor is connected to the third resistor, a drain of the fourteenth PMOS transistor is connected to a source of the thirteenth PMOS transistor;
a drain of the thirteenth PMOS transistor is connected to a drain of the twelfth NMOS transistor, a source of the twelfth NMOS transistor is connected to a drain of the eleventh NMOS transistor, a source of the eleventh NMOS transistor is connected to the ground;
a source of the fifteenth PMOS transistor is connected to the source of the thirteenth PMOS transistor, a gate of the fifteenth PMOS transistor is connected to the drain of the thirteenth PMOS transistor, a drain of the fifteenth PMOS transistor is connected to the ground.

10. The amplifier of claim 9, wherein the Schmitt trigger further comprises a sixteenth NMOS transistor, wherein
a source of the sixteenth NMOS transistor is connected to the source of the twelfth NMOS transistor, a gate of the sixteenth NMOS transistor is connected to the gate of the fifteenth PMOS transistor, a drain of the sixteenth NMOS transistor is connected to the third resistor.

11. The amplifier of claim 7, wherein the Schmitt trigger comprises an eleventh NMOS transistor, a twelfth NMOS transistor, a thirteenth PMOS transistor, a fourteenth PMOS transistor, and a sixteenth NMOS transistor,
wherein gates of all of the eleventh NMOS transistor, the twelfth NMOS transistor, the thirteenth PMOS transistor and the fourteenth PMOS transistor are connected to the drain of the seventh PMOS transistor;
a source of the fourteenth PMOS transistor is connected to the third resistor, a drain of the fourteenth PMOS transistor is connected to a source of the thirteenth PMOS transistor;
a drain of the thirteenth PMOS transistor is connected to a drain of the twelfth NMOS transistor, a source of the twelfth NMOS transistor is connected to a drain of the eleventh NMOS transistor, a source of the eleventh NMOS transistor is connected to the ground;
a source of the sixteenth NMOS transistor is connected to the source of the twelfth NMOS transistor, a gate of the sixteenth NMOS transistor is connected to the drain of the twelfth NMOS transistor, a drain of the sixteenth NMOS transistor is connected to the third resistor.

12. A method of amplifying, comprising:
generating a bias current which is independent of the power supply, so as to increase power supply rejection ratio;
receiving an input voltage and generating an amplified voltage based on the biasing current;
outputting a modified voltage by rectifying the amplified voltage to square wave,
wherein the biasing unit comprises a first NMOS transistor, a second NMOS transistor, a third PMOS transistor, a current mirror, a first resistor; wherein
a source of the first NMOS transistor is connected to a ground, a gate of the first NMOS transistor is connected to both the first resistor and a source of the second NMOS transistor, a drain of the first NMOS transistor is connected to both a gate of the second NMOS transistor and a first port of the current mirror;
a drain of the second NMOS transistor is connected to a second port of the current mirror;
a source of the third PMOS transistor is connected to a second voltage supply, and a drain of the third PMOS transistor is configured to output the biasing current.

13. The method of claim 12, further comprising
generating an output voltage by buffering the modified voltage.

14. The method of claim 12, wherein
the current source comprises a fourth PMOS transistor and a fifth PMOS transistor, wherein the first port the current mirror comprises a drain of the fifth PMOS transistor, the second port of the current mirror comprises a drain of the fourth PMOS transistor, the gate of the fourth PMOS transistor is connected to a gate of the fifth PMOS transistor, both sources of the fourth PMOS transistor and the fifth PMOS transistor are connected to the positive power supply.

15. The method of claim 12, further comprising a sixth PMOS transistor, a first inverter and a second inverter both connected to the Schmitt trigger and configured to generate an output voltage by buffering the modified voltage, wherein a source of the sixth PMOS transistor is connected to the positive power supply, a gate of the sixth PMOS transistor is connected to the gate of the third PMOS transistor, a drain of the sixth PMOS transistor is connected to the second inverter and is configured to provide a power supply for the second inverter.

16. The method of claim 15, wherein the first inverter further comprises a seventeenth MOS transistor and an eighteenth MOS transistor,
wherein a source of the seventeenth PMOS transistor is connected to the third resistor, both gates of the seventeenth PMOS transistor and the eighteenth NMOS transistor are connected to the drain of the twelfth NMOS transistor, a drain of the seventeenth PMOS transistor is connected to a drain of the eighteenth NMOS transistor, a source of the eighteenth NMOS transistor is connected to the ground.

17. The method of claim 16, wherein the second inverter further comprises a nineteenth PMOS transistor and an twentieth NMOS transistor,
wherein a source of the nineteenth PMOS transistor is connected to the third resistor, both gates of the nineteenth PMOS transistor and the twentieth MOS transistor are connected to the drain of the seventeenth PMOS transistor, a drain of the nineteenth PMOS transistor is connected to a drain of the twentieth NMOS transistor, a source of the twentieth NMOS transistor is connected to the ground.

18. The method of claim 12, wherein the amplifying unit comprises a seventh PMOS transistor, an eighth NMOS transistor, a first capacitor and a fifth resistor; wherein
both gates of the seventh PMOS transistor and the eighth NMOS transistor are configured to receive an input voltage via the first capacitor; both drains of the seventh PMOS transistor and the eighth NMOS transistor are connected to the Schmitt trigger, and the source of the seventh PMOS transistor is connected to the drain of the third PMOS transistor via a second resistor, a third resistor and a fourth resistor in serials, a source of the eighth NMOS transistor is connected to the ground; wherein the fifth resistor is connected between the first capacitor and the drain of the eighth NMOS transistor.

19. The method of claim 18, wherein the amplifying unit further comprises a ninth PMOS transistor, a tenth NMOS transistor, and a second capacitor, and a sixth resistor; wherein
a source of the ninth PMOS transistor is connected to the source of the seventh PMOS transistor, a gate of the ninth PMOS transistor is connected to the ground via the second capacitor, a drain the ninth PMOS transistor is connected to both a gate and a drain of the tenth NMOS transistor; a source of the tenth NMOS transistor is connected to the ground; wherein the sixth resistor is connected between the second capacitor and the drain of the eighth NMOS transistor.

20. The method of claim 18, wherein the Schmitt trigger comprises an eleventh NMOS transistor, a twelfth NMOS transistor, a thirteenth PMOS transistor, a fourteenth PMOS transistor, and a fifteenth PMOS transistor,
wherein gates of all of the eleventh NMOS transistor, the twelfth NMOS transistor, the thirteenth PMOS transistor and the fourteenth PMOS transistor are connected to the drain of the seventh PMOS transistor;
a source of the fourteenth PMOS transistor is connected to the third resistor, a drain of the fourteenth PMOS transistor is connected to a source of the thirteenth PMOS transistor;
a drain of the thirteenth PMOS transistor is connected to a drain of the twelfth NMOS transistor, a source of the twelfth NMOS transistor is connected to a drain of the eleventh NMOS transistor, a source of the eleventh NMOS transistor is connected to the ground;
a source of the fifteenth PMOS transistor is connected to the source of the thirteenth PMOS transistor, a gate of the fifteenth PMOS transistor is connected to the drain of the thirteenth PMOS transistor, a drain of the fifteenth PMOS transistor is connected to the ground.

21. The method of claim 20, wherein the Schmitt trigger further comprises a sixteenth NMOS transistor, wherein
a source of the sixteenth NMOS transistor is connected to the source of the twelfth NMOS transistor, a gate of the sixteenth NMOS transistor is connected to the gate of the fifteenth PMOS transistor, a drain of the sixteenth NMOS transistor is connected to the third resistor.

22. The method of claim 18, wherein the Schmitt trigger comprises an eleventh NMOS transistor, a twelfth NMOS transistor, a thirteenth PMOS transistor, a fourteenth PMOS transistor, and a sixteenth NMOS transistor,
wherein gates of all of the eleventh NMOS transistor, the twelfth NMOS transistor, the thirteenth PMOS transistor and the fourteenth PMOS transistor are connected to the drain of the seventh PMOS transistor;

a source of the fourteenth PMOS transistor is connected to the third resistor, a drain of the fourteenth PMOS transistor is connected to a source of the thirteenth PMOS transistor;

a drain of the thirteenth PMOS transistor is connected to a drain of the twelfth NMOS transistor, a source of the twelfth NMOS transistor is connected to a drain of the eleventh NMOS transistor, a source of the eleventh NMOS transistor is connected to the ground;

a source of the sixteenth NMOS transistor is connected to the source of the twelfth NMOS transistor, a gate of the sixteenth NMOS transistor is connected to the drain of the twelfth NMOS transistor, a drain of the sixteenth NMOS transistor is connected to the third resistor.

* * * * *